United States Patent [19]

Ryu

[11] Patent Number: 5,847,596
[45] Date of Patent: Dec. 8, 1998

[54] INTERNAL VOLTAGE GENERATOR

[75] Inventor: Myung Sunn Ryu, Kyoungki-do, Rep. of Korea

[73] Assignee: Hyundai Electronics Industries Co., Ltd., Ichon-shi, Rep. of Korea

[21] Appl. No.: 885,835

[22] Filed: Jun. 30, 1997

[30] Foreign Application Priority Data

Jun. 29, 1996 [KR] Rep. of Korea ............... 1996-25752

[51] Int. Cl.$^6$ ...................................................... G05F 1/10
[52] U.S. Cl. .......................... 327/536; 327/141; 327/530; 327/535
[58] Field of Search ................................. 327/141, 156, 327/162, 530, 534, 535, 536

[56] References Cited

U.S. PATENT DOCUMENTS

| | | | |
|---|---|---|---|
| 5,452,253 | 9/1995 | Choi | 365/201 |
| 5,677,649 | 10/1997 | Martin | 327/536 |

*Primary Examiner*—Timothy P. Callahan
*Assistant Examiner*—Jeffrey Zweizig
*Attorney, Agent, or Firm*—Thelen Reid & Priest LLP

[57] ABSTRACT

An internal voltage generator for a semiconductor device. Whereas a feedback signal is given to maintain a voltage of a predetermined level by a voltage detector in the conventional art, the internal voltage generator adopts a method of adjusting the period. Therefore, the variance of a signal generated due to a time delay can be reduced. The internal voltage generator includes an oscillator for generating pulses of a predetermined period when a power-up signal is activated, a timing generator for generating appropriate timing according to the output of the oscillator for determining the basic operational period of a voltage pump and a series of signals, a pump driver for controlling a voltage pump to operate with a predetermined phase by controlling a pulse signal from the oscillator by the pulse signal of a predetermined period generated from the timing generator, and a voltage pump for pumping voltage to a third voltage and outputting the same.

4 Claims, 8 Drawing Sheets

INTERNAL VOLTAGE GENERATOR

BACKGROUND OF THE INVENTION

The present invention relates to an internal voltage generator for a semiconductor device, and more particularly, to an internal voltage generator for controlling a high voltage (Vpp) generator by a predetermined timing signal.

FIGS. 1 and 2 show a conventional internal voltage (a third voltage) generator with load capacitances, and further illustrates storage capacitance being changed by predetermined signals 1 and 2. At this time, the third voltage (internal voltage) generator includes two voltage pumps. The first voltage pump (pump means generator) maintains the value of the third voltage to a value designated within a constant error using a feedback signal by a voltage detector. In the contrary, the second voltage pump reverses the rapid change in the third voltage occurred by the changed storage capacitance in a short time, thereby functioning to prevent the third voltage from deviating from the designated value. Therefore, the second voltage pump necessitates a fast reaction speed in contrast to the first voltage pump.

FIG. 3 is a schematic diagram of the conventional second voltage pump.

Since the operation of the conventional second voltage pump depends upon the feedback signal by the voltage detector like the first voltage pump, a time delay occurs from the time when the change in the third voltage exceeds a predetermined value to the time when the second voltage pump operates. Accordingly, the third voltage may fluctuate (see FIG. 4).

SUMMARY OF THE INVENTION

An objective of the present invention to provide an internal voltage generator which can reduce voltage fluctuation of a high voltage port due to a time delay, by removing the delay by the feedback of a voltage detector.

To accomplish the above objective of the present invention, an internal voltage generator is provided and comprises:

an oscillator for generating pulses of a predetermined period when a power-up signal is activated;

timing generating means for generating appropriate timing according to the output of the oscillator for determining the basic operational period of a voltage pump and a series of signals;

pump driving means for controlling a voltage pump to operate with a predetermined phase by controlling a pulse signal from the oscillator by the pulse signal of a predetermined period generated from the timing generating means; and a voltage pump for pumping a voltage to a third voltage and outputting the same.

According to another aspect of the present invention, an internal voltage generator is provided and comprises:

an oscillator for generating pulses of a predetermined period when a power-up signal is activated;

timing generating means for generating appropriate timing according to the output of the oscillator for determining the basic operational period of a voltage pump and a series of signals;

pump driving means for controlling a voltage pump to operate with a predetermined phase by controlling a pulse signal from the oscillator by the pulse signal of a predetermined period generated from the timing generating means;

a voltage pump for pumping a voltage to a third voltage and outputting the same; and voltage detecting means for controlling the timing generating means to output a timing signal as a signal having a longer period by the length of a clock pulse when the third voltage is still low after the operation of the voltage pump is completed by the counting of the timing generating means.

BRIEF DESCRIPTION OF THE DRAWINGS

The above objective and advantages of the present invention will become more apparent by describing a preferred embodiment thereof in detail with reference to the attached drawings in which.

DETAILED DESCRIPTION OF THE INVENTION

Preferred embodiments of the present invention will now be described with reference to accompanying drawings.

Figure 1:
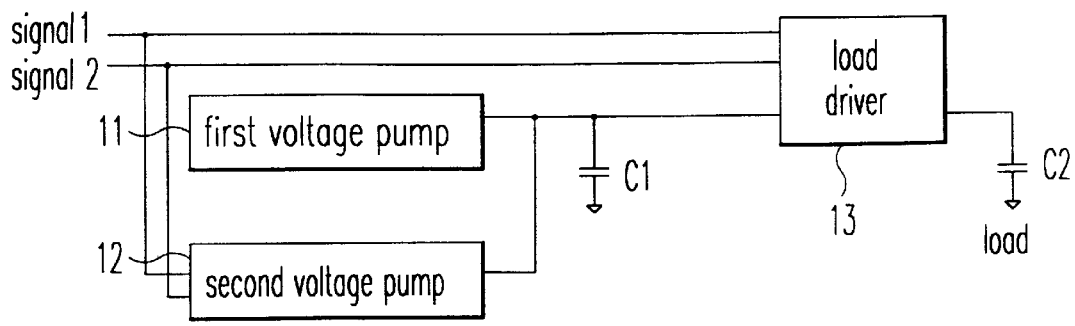
FIG. 1 is a schematic diagram of a conventional internal voltage generator with load capacitances.
Figure 2:
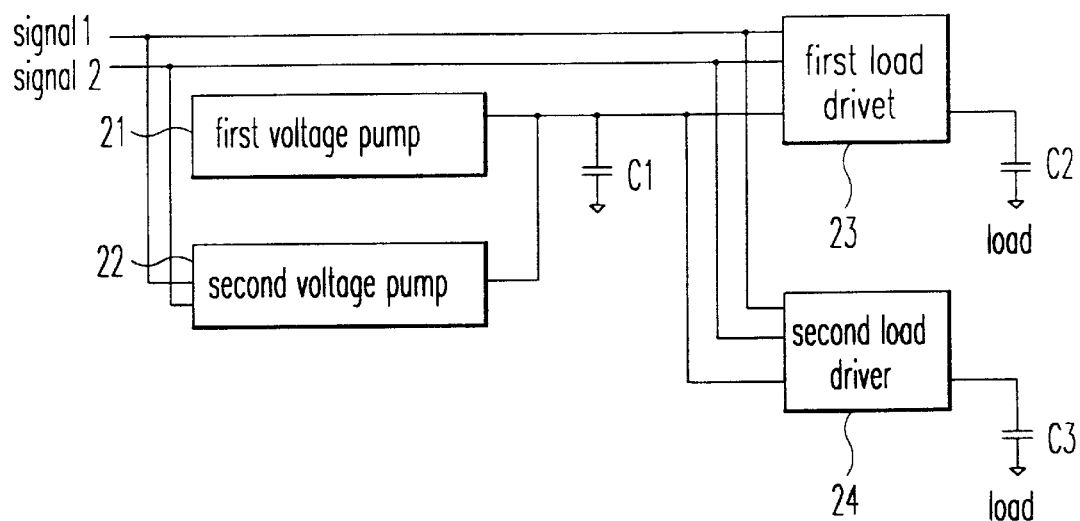
FIG. 2 is a schematic diagram of another conventional internal voltage generator with load capacitances.
Figure 3:
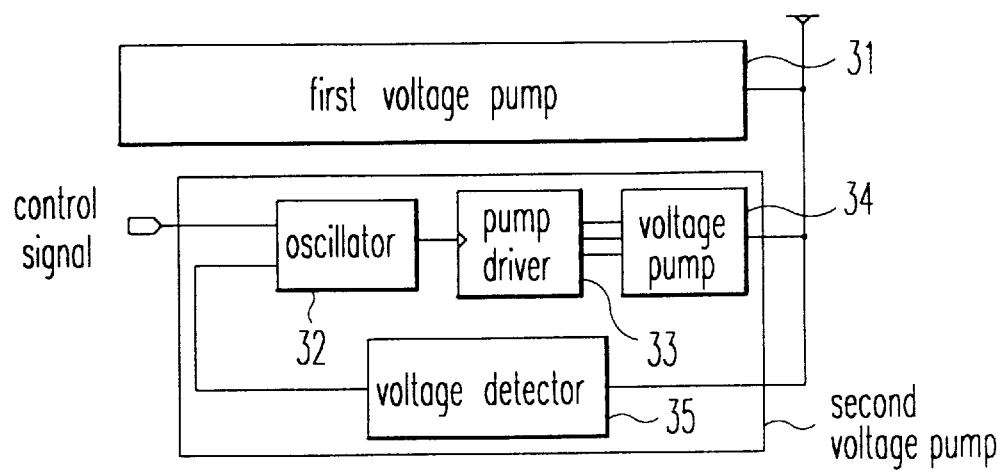
FIG. 3 is a schematic diagram of a conventional voltage generator using the feedback of a voltage detector.
Figure 4:
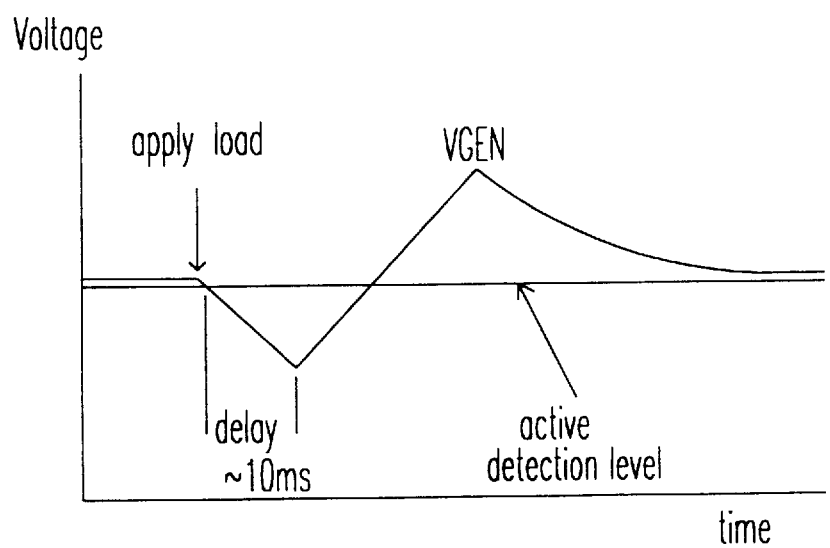
FIG. 4 is an operational waveform diagram of the conventional voltage detector.
Figure 5:
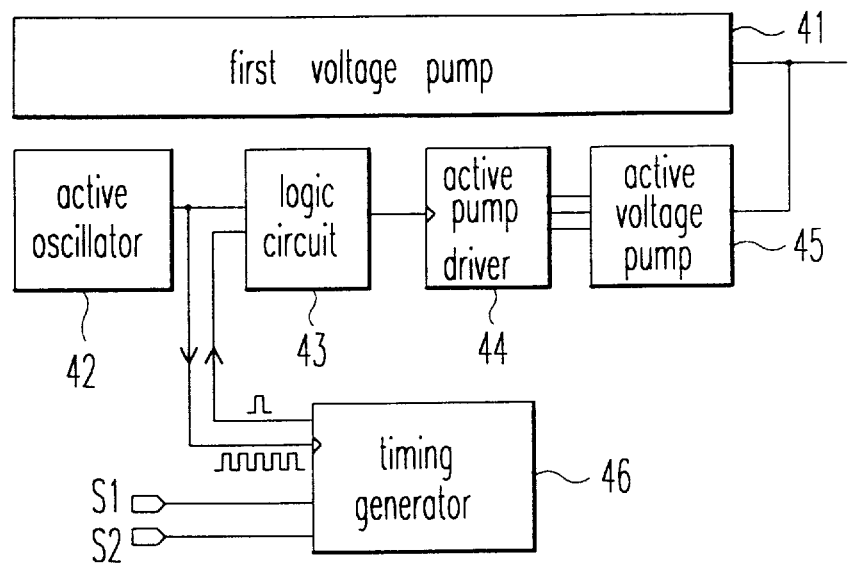
FIG. 5 is a schematic diagram of an internal voltage generator according to a first embodiment of the present invention.

FIG. 5 illustrates an example of driving the second voltage pump using a timing generator 46 for generating an appropriate timing according to the output of an oscillator 42 and a series of signals S1 and S2.

Referring to FIG. 5, the internal voltage generator includes an oscillator 42 for generating pulses of a predetermined period when a power-up signal is activated, a timing generator 46 for generating an appropriate timing according to the output of the oscillator 42 for determining the basic operational period of a voltage pump 45 and a series of signals S1 and S2, a pump drier 44 for controlling the voltage pump 45 to operate with a constant phase by controlling a pulse signal from the oscillator 42 by the pulse signal of a predetermined period generated from the timing generator 46, and the voltage pump 45 for pumping a voltage to a third voltage and outputting the same.

Figure 6:
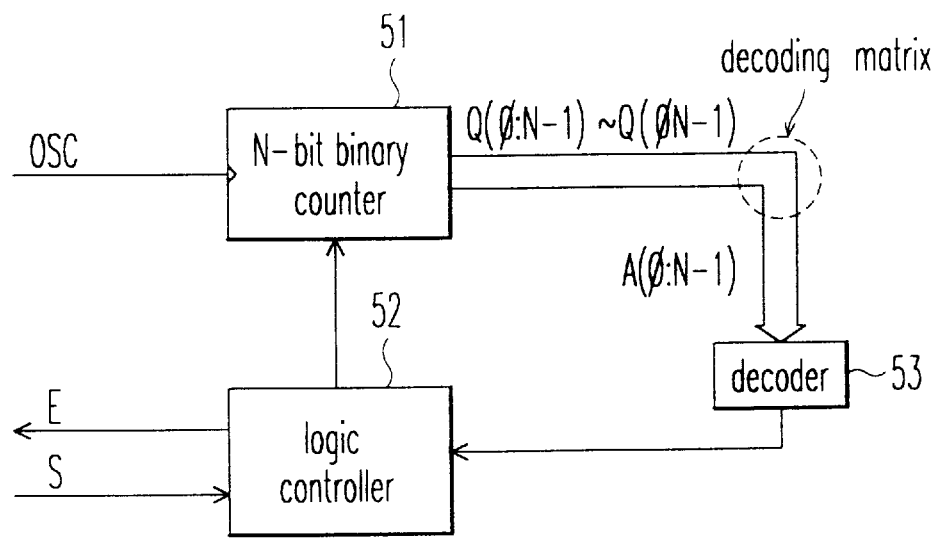
FIG. 6 is a first schematic diagram of a timing generator used in the first embodiment of the present invention.
Figure 8:
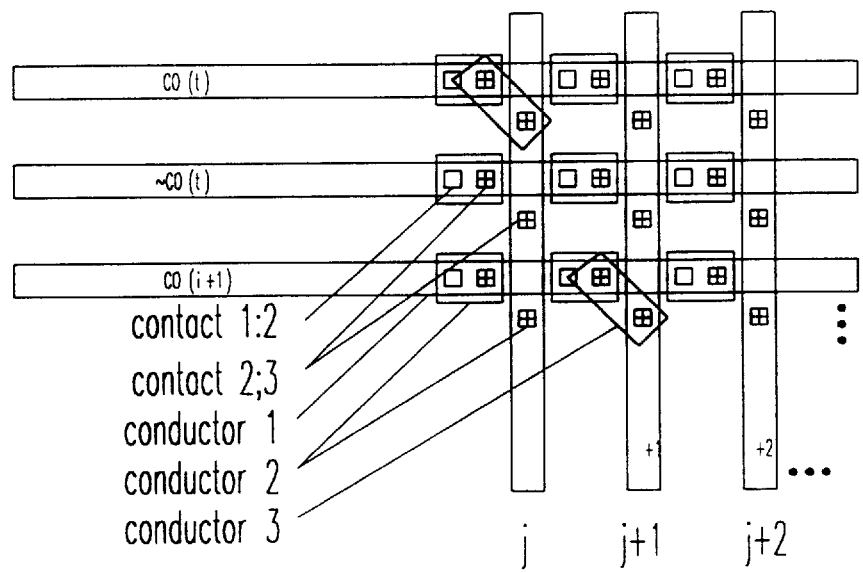
FIG. 8 is a layout diagram of a decoding matrix of a decoder shown in FIGS. 6 and 7.

FIG. 6 illustrates an example of implementing the timing generator 46 which is an essential part of the present invention. In this example, a method is illustrated for generating a timing signal E having a length of a constant pulse number by counting the output (osc) of the oscillator of the second voltage pump by a pulse counter. Here, the counter outputs Q[0 . . . N−1] and ~Q[0 . . . N−1] are obtained by outputting the number of pulses as a binary symbol and a symbol of 1 after the respective reset signals terminate. When the signal S is in a first voltage level, the output E of the timing generator retains a second voltage level, and a reset signal is inputted to an N-bit binary counter 51 to inhibit the operation of the same. When the voltage level of the signal is changed to the second voltage, the reset signal for the N-bit binary counter 51 terminates and the voltage of the output E of the timing generator is changed to the first voltage. The N-bit binary counter 51 changes the binary outputs according to the number of pulses inputted to the OSC port. A decoder 53 adopting a multiplex input AND gate receives the N-bit binary counter 51 and outputs the first voltage by a decoding matrix (see FIG. 8) when the pulses of a predetermined number are counted. The number of pulses can be programmed using a second conductor layer of the decoding matrix. If the output of the decoder 53 becomes the first voltage, a reset signal is inputted to the N-bit binary counter 51 and the voltage of the timing signal E is changed to the second voltage. The pulses of the number determined by the combination of the timing signal E and the output (OSC) of the oscillator are input to the pump driver 44 shown in FIG. 5.

Figure 7:
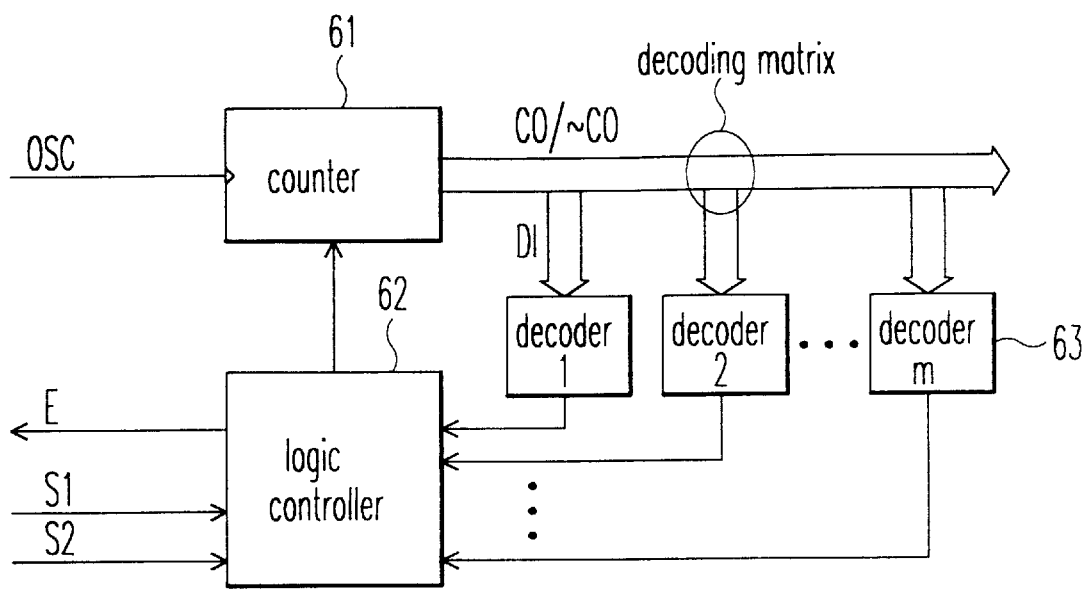
FIG. 7 is a second schematic diagram of a timing generator used in the first embodiment of the present invention.

FIG. 7 shows a timing generator for generating various timings according to a series of signals S[1 . . . N] using a plurality of decoders 1 through m. Here, a logic controller 62 includes a circuit for selecting one of a plurality of decoding matrixes [1 . . . M] by the combination of the series of signals S[1 . . . N] and the timing signal E.

Figure 9A:
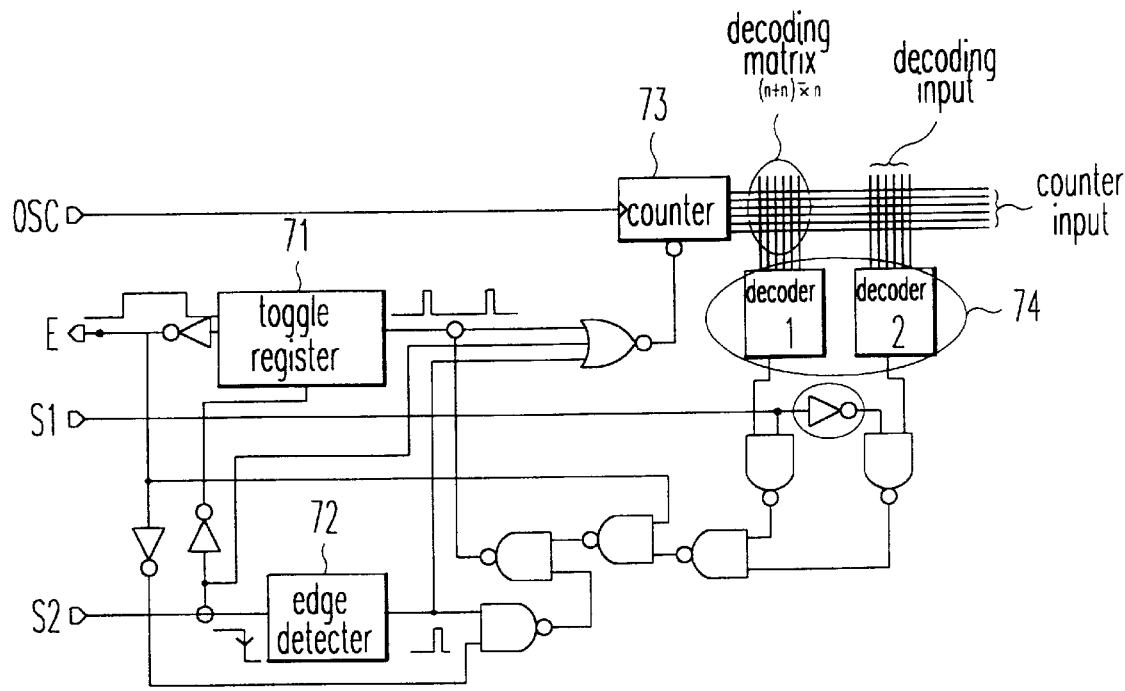
FIGS. 9A and 9B are a third schematic diagram of a timing generator used in the first embodiment of the present invention and an operational waveform diagram thereof, respectively.
Figure 9B:
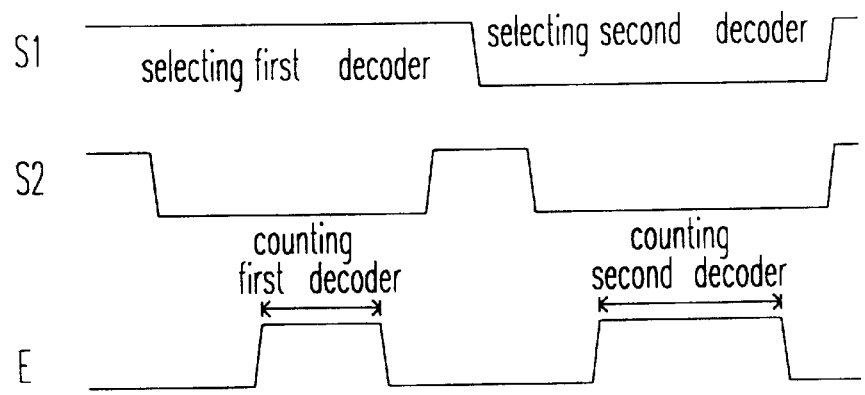

FIG. 9A shows an example of the timing generator using a counter 73, illustrating the generation of timings shown in FIG. 9B by the combination of signals S1 and S2 using two decoders 1 and 2, in which the S1 is used for selecting the number of necessary pulses depending on the variance of the storage capacitance of the third voltage port and the signal S2 is used as a trigger signal of the voltage pump.

Figure 10A:
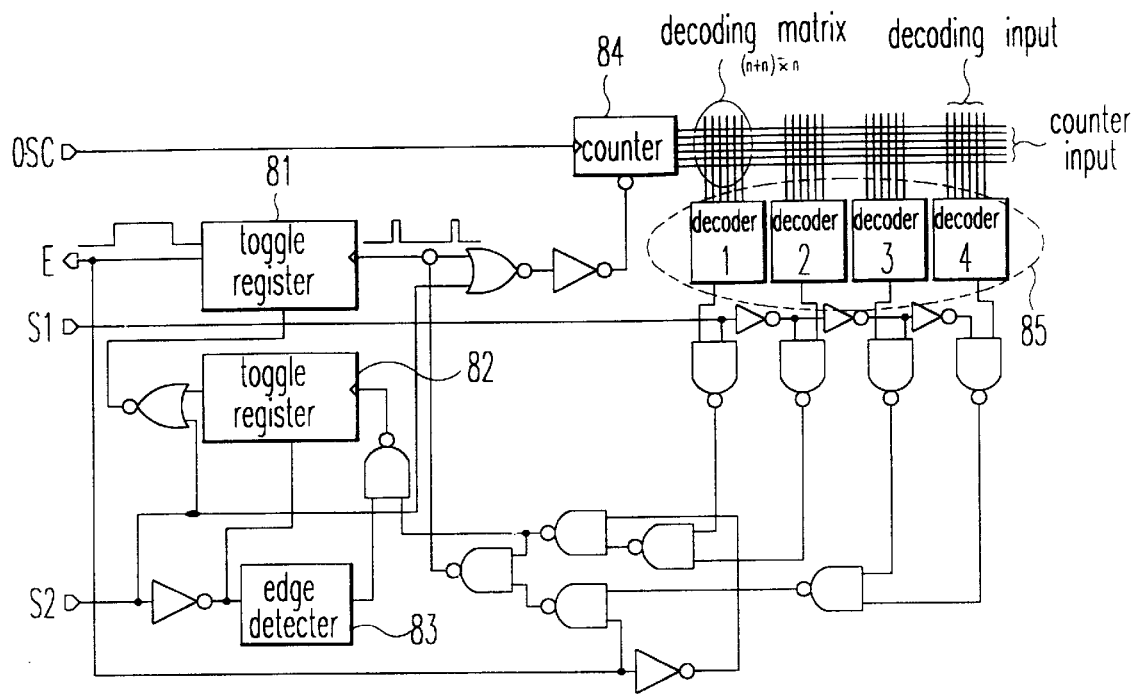
FIGS. 10A and 10B are a fourth schematic diagram of a timing generator used in the first embodiment of the present invention and an operational waveform diagram thereof, respectively.
Figure 10B:
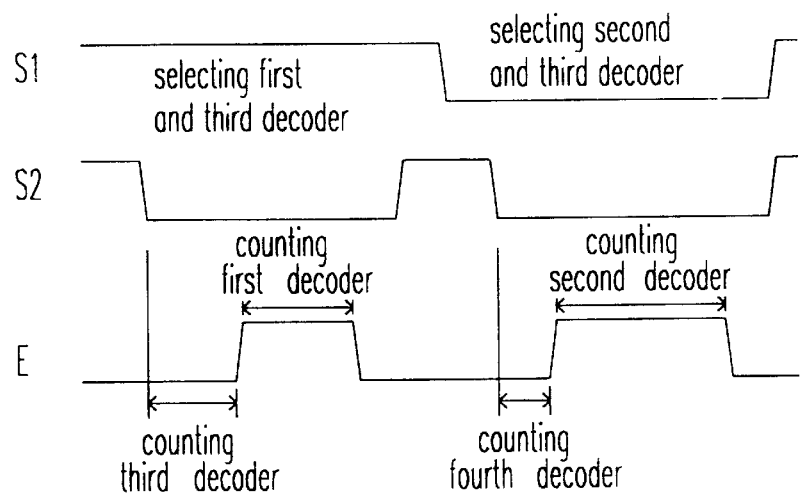

FIG. 10A shows another example of the timing generator using a counter 84, in which separate decoders 3 and 4 and T-flipflop circuits are added to supply the output of the timing signal E with a delay.

Figure 11:
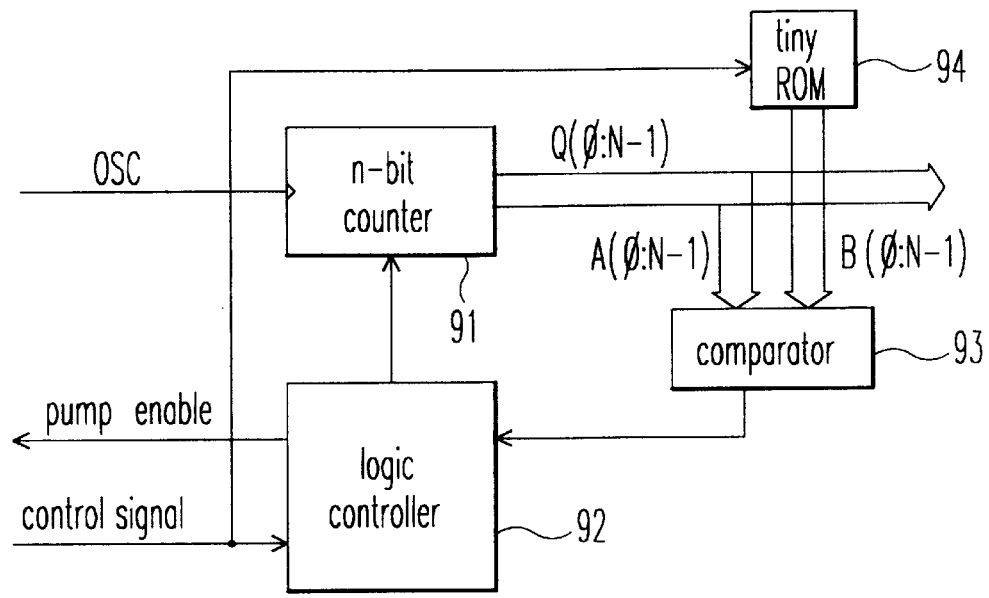
FIG. 11 is a fifth schematic diagram of a timing generator used in the first embodiment of the present invention.

FIG. 11 shows an example of the timing generator using an EEPROM (tint ROM 94) and a comparator 93 instead of decoders (85 of FIG. 10A) and decoding matrixes, in which timings are programmed electrically.

Figure 12:
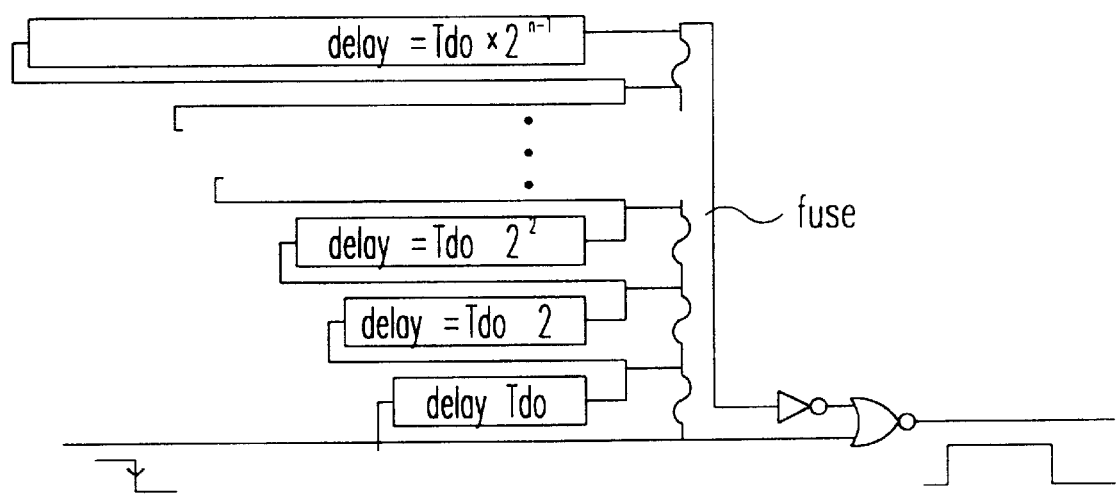
FIG. 12 is a sixth schematic diagram of a timing generator used in the first embodiment of the present invention.

FIG. 12 shows an example of the timing generator using a series of binary delay chains which can change a delay value with by-passing fuses instead of the n-bit counter 91 shown in FIG. 11. The output timings can be adjusted by opening or shorting the by-passing fuses of the respective delay chains.

Figure 13:
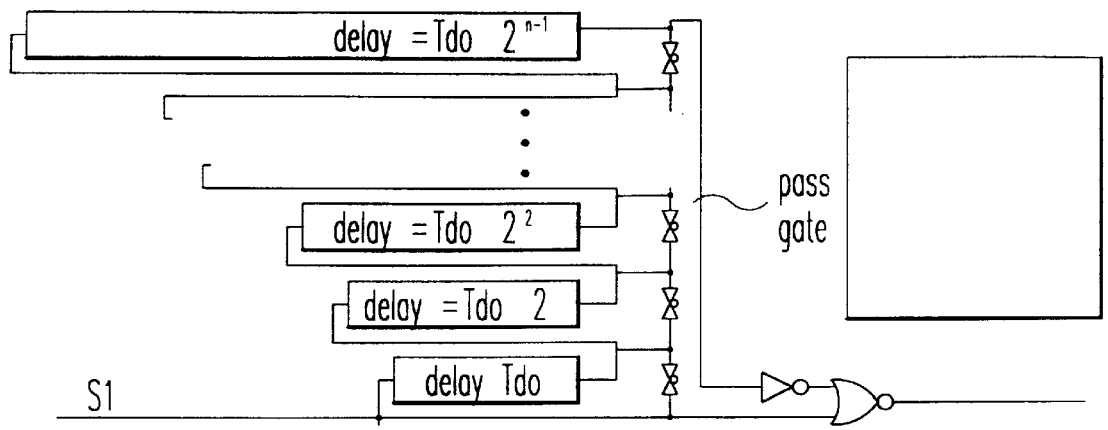
FIG. 13 is a seventh schematic diagram of a timing generator used in the first embodiment of the present invention.

FIG. 13 shows that the overall delay due to the delay chains is adjusted using pass gates instead of the by-passing fuses shown in FIG. 12.

Figure 14:
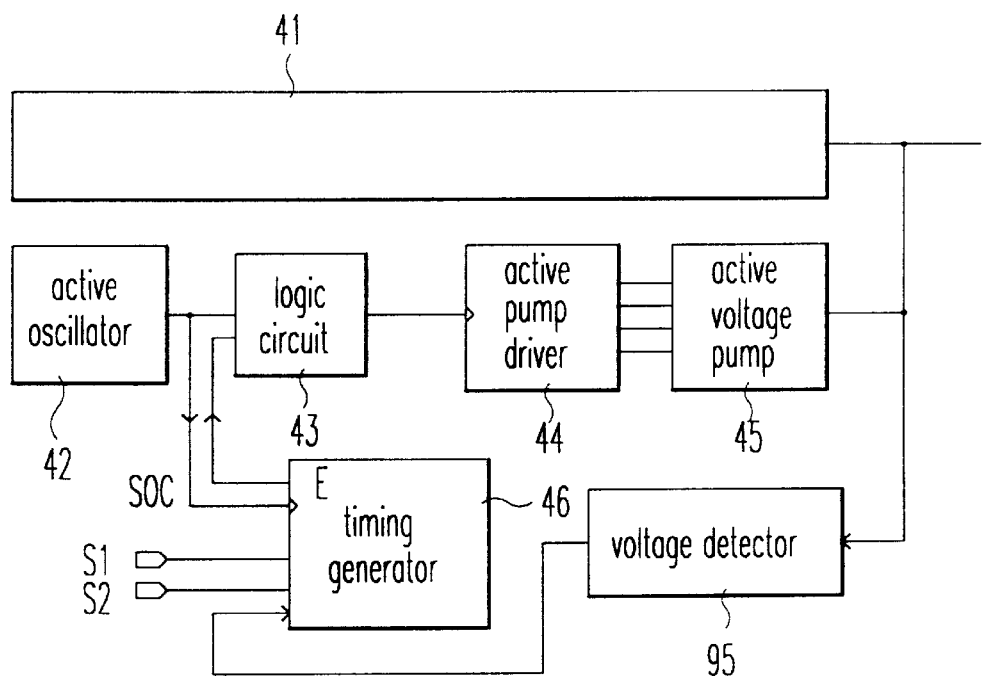
FIG. 14 is a schematic diagram of an internal voltage generator according to a second embodiment of the present invention.

FIG. 14 is a schematic diagram of an internal voltage generator according to a second embodiment of the present invention, in which the output signal of a voltage detector 95 is used for changing the output of a timing generator.

The internal voltage generator shown in FIG. 14 includes an oscillator 42 for generating pulses of a predetermined period when a power-up signal is activated, a timing generator 46 for generating appropriate timing according to the output of the oscillator 42 for determining the basic operational period of a voltage pump 45 and a series of signals, a pump drier 44 for controlling the voltage pump 45 to operate with a constant phase by controlling a pulse signal from the oscillator 42 by the pulse signal of a predetermined period generated from the timing generator 46, the voltage pump 45 for pumping a voltage to a third voltage and outputting the same, and a voltage detector 95 for controlling the timing generator 46 to output a timing signal as a signal having a longer period by the length of one pulse when the third voltage is still low after the operation of the voltage pump 45 is completed by the counting of the timing generator 46.

If the timing signal is in the first voltage level and the output of the voltage detector 94 indicates that the third voltage is too high, the timing signal returns to the second voltage and terminates. If the output of the voltage detector 95 indicates that the third voltage is still too low even when the counting is completed, the timing signal is outputted as a signal having a one pulse longer period. This method is adopted for attaining a fast reaction speed and stability.

As described above, whereas a feedback signal is given to maintain a voltage of a predetermined level by a voltage detector in the conventional art, the internal voltage generator according to the present invention adopts a method of adjusting the period. Therefore, the variance of a signal generated by a time delay can be reduced.

What is claimed is:

1. An internal voltage generator for a semiconductor device comprising:

an oscillator for generating pulses of a predetermined period when a power-up signal is activated;

timing generating means for generating appropriate timing according to the output of said oscillator for determining the basic operational period of a voltage pump and a series of signals;

pump driving means for controlling a voltage pump to operate with a predetermined phase by controlling a pulse signal from said oscillator by the pulse signal of a predetermined period generated from said timing generating means; and a voltage pump for pumping a voltage to a third voltage and outputting the same.

2. An internal voltage generator as claimed in claim 1, wherein said timing generating means includes a logic circuit for generating another timing according to the connection state of contacts and conductors for programming said timing.

3. An internal voltage generator as claimed in claim 1, wherein said timing generating means includes a series of delay chains capable of changing delay values for programming said timing, and a logic circuit.

4. An internal voltage generator for a semiconductor device comprising:

an oscillator for generating pulses of a predetermined period when a power-up signal is activated;

timing generating means for generating appropriate timing according to the output of said oscillator for determining the basic operational period of a voltage pump and a series of signals;

pump driving means for controlling a voltage pump to operate with a predetermined phase by controlling a pulse signal from said oscillator by the pulse signal of a predetermined period generated from said timing generating means;

a voltage pump for pumping a voltage to a third voltage and outputting the same; and voltage detecting means for controlling said timing generating means to output a timing signal as a signal having a longer period by the length of a clock pulse when the third voltage is still low after the operation of said voltage pump is completed by the counting of said timing generating means.

* * * * *